（12） United States Patent
Chen et al.

(10) Patent No.: US 11,800,678 B2
(45) Date of Patent: Oct. 24, 2023

(54) COLD PLATE (71) Applicant: AURAS TECHNOLOGY CO., LTD., New Taipei (TW)

(72) Inventors: Chien-An Chen, New Taipei (TW); Chien-Yu Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 417 days.

(21) Appl. No.: 17/026,469

(22) Filed: Sep. 21, 2020

(65) Prior Publication Data

US 2021/0127526 A1 Apr. 29, 2021

(30) Foreign Application Priority Data

Oct. 25, 2019 (TW) ................................ 108138666

(51) Int. Cl.
*H05K 7/20* (2006.01)
(52) U.S. Cl.
CPC ..... *H05K 7/20254* (2013.01); *H05K 7/20272* (2013.01)
(58) Field of Classification Search
CPC ....................... H05K 7/20254; H05K 7/20272
USPC ........................................................ 165/168
See application file for complete search history.

(56) References Cited

U.S. PATENT DOCUMENTS

| 7,360,583 B2* | 4/2008 | Liu ....................... H01L 23/473 417/313 |
| 8,013,484 B2* | 9/2011 | Yang ................... F04D 13/0606 417/423.1 |
| 8,746,330 B2* | 6/2014 | Lyon .................. H05K 7/20254 165/170 |
| 9,907,207 B1* | 2/2018 | Wu ...................... H05K 7/20272 |
| 10,681,841 B2* | 6/2020 | Han ...................... H01L 23/473 |
| 2007/0103869 A1* | 5/2007 | Liu ....................... H01L 23/473 257/E23.098 |
| 2009/0218072 A1* | 9/2009 | Eriksen .............. H05K 7/20272 165/80.2 |
| 2018/0255662 A1* | 9/2018 | Fan ........................ F04D 29/526 |
| 2018/0340744 A1* | 11/2018 | Tsai .................... H05K 7/20272 |
| 2020/0011609 A1* | 1/2020 | Chen ..................... H01L 23/473 |

* cited by examiner

*Primary Examiner* — Claire E Rojohn, III
(74) *Attorney, Agent, or Firm* — AMIN, TUROCY & WATSON, LLP (57) ABSTRACT

A cold plate is provided and includes a casing, a guiding baffle, a base, a first inlet passage, an outlet passage and a pump. The guiding baffle is disposed in the casing and defines a fluid storage chamber together with the casing. The fluid storage chamber is filled with a working medium. The guiding baffle includes a communication opening. The base, the casing and guiding baffle together define a working space. The working medium flows into the working space through the communication opening, and the base is used for absorbing thermal energy and transfers the thermal energy to the working medium. The first inlet passage communicates with the fluid storage chamber and allows the cooled working medium to flow into the fluid storage chamber. The outlet passage communicates with the working space to allow the heated working medium to be discharged from the working space.

19 Claims, 8 Drawing Sheets

COLD PLATE

BACKGROUND

1. Technical Field

The present disclosure relates to a cold plate, and more particularly, to a cold plate with a fluid storage chamber.

2. Description of Related Art

With the advancement and prevalence of technology, various electronic devices and computers, such as laptops, desktop computers, network servers, have long played an indispensable role in our daily life. Typically, the temperatures of the electronic components within these products increase during operations. The high temperatures may cause damages to the components. Heat dissipating mechanisms are thus part of an important and necessary design of these electronic products. A common heat dissipating design employs fans for cooling by air circulation. Another design includes attaching a heat sink made of a special material to the component to reduce temperature through heat transfer. Water cooling is also another effective and common heat dissipating design.

The principle behind water cooling is basically using fluid (e.g., water or coolant) as a heat dissipating medium that continuously circulates inside a system subjected to cooling by a pump. The fluid flows inside enclosed passages that are distributed on the surfaces of each of the electronic components (e.g., a central processing unit) in the system. When the fluid with relatively low temperature flows pass the electronic components with relatively high temperatures, it absorbs the heat to slow down the rise of the temperatures. Heat is then transferred (or via other heat dissipating mechanisms) from these passages to the external environment to release the heat, thereby reducing the temperature of the fluid. The fluid is then circulated back into the system for more cooling.

As an example, a cold plate is one of the main heat dissipating components in a water cooling system. A traditional cold plate is made of copper or aluminum with structures, such as a chamber and a water passage, formed therein to allow the inflow of cooling fluid of a lower temperature. The cold plate is in direct contact with an electronic component, such that the cooling fluid of a lower temperature flowing inside the chamber or the water passage absorbs the heat of the electronic component before flowing out of the cold plate. As such, heat can be carried away when the electronic component is in operation.

However, most of these conventional cold plates are not provided with fluid storage chambers, so when the cold plate is relocated or moved, there may be an under supply of the cooling fluid. Therefore, there is a need for a solution that addresses the aforementioned shortcoming in the prior art.

SUMMARY

The present disclosure is to provide a cold plate having a fluid storage chamber defined by a guiding baffle and a casing together. This allows temporarily storage of a working medium and ensures uninterrupted supply of the working medium. The ease and flexibility of assembly of the cold plate are also improved.

The other objectives and advantages of the present disclosure can become more apparent from the technical features disclosed by the present disclosure.

In order to achieve one, some or all of the objectives above and other objectives, the present disclosure provides a cold plate, which may include a casing, a guiding baffle, a base, a first inlet passage, an outlet passage and a pump. The guiding baffle is disposed in the casing and defines a fluid storage chamber together with the casing. The fluid storage chamber is filled with a working medium. The guiding baffle includes a communication opening. The base, the casing and the guiding baffle together define a working space, and the guiding baffle is located between the casing and the base. The working medium flows into the working space through the communication opening, and the base is used for absorbing thermal energy and transfers the thermal energy to the working medium. The first inlet passage communicates with the fluid storage chamber and allows the working medium to flow into the fluid storage chamber. The outlet passage communicates with the working space to allow the working medium to be discharged from the working space. The pump is disposed in the casing and is used for guiding the working medium in the working space to the outlet passage.

In an embodiment of the present disclosure, the cold plate described above may further include a second inlet passage in communication with the fluid storage chamber, wherein the first inlet passage is located at a first side of the casing, the second inlet passage is located at a second side of the casing opposite to the first side, and the outlet passage is located at the first side of the casing adjacent to the first inlet passage.

In an embodiment of the present disclosure, the casing described above may include an electromechanical chamber and a groove in communication with each other, an opening of the electromechanical chamber is located at a top side of the casing, and an opening of the groove is located at a bottom side of the casing opposite to the top side.

In an embodiment of the present disclosure, the pump described above may include a circuit board, a first magnetic component, an impeller and a second magnetic component, the circuit board and the first magnetic component are disposed in the electromechanical chamber, the circuit board is provided on a top of the first magnetic component, and the circuit board is exposed from the opening of the electromechanical chamber, the impeller and the second magnetic component are disposed in the groove, the second magnetic component is located between the first magnetic component and the impeller, and the second magnetic component is passed through the first magnetic component to be coaxially provided with the first magnetic component.

In an embodiment of the present disclosure, the pump described above may further include a fastening component provided between the impeller and the base, the fastening component is secured onto the casing to secure the impeller and the second magnetic component in the groove.

In an embodiment of the present disclosure, the impeller described above may include a base plate and a hollow portion, the base plate partitions the working space into a heat absorbing space and a fluid discharging space, the groove includes the fluid discharging space, a portion of the heat absorbing space is located below the guiding baffle, and the working medium in the heat absorbing space and the fluid discharging space undergoes fluid coupling through the hollow portion, the working medium flows into the heat absorbing space through the communication opening, and is sucked from the heat absorbing space by the impeller and passed into the fluid discharging space via the hollow portion.

In an embodiment of the present disclosure, the base described above may include a top and a heat absorbing bottom opposite to each other, the heat absorbing bottom is in contact with a heat source and absorbs the thermal energy, the top is provided with a heat transfer structure, the heat transfer structure is located in the heat absorbing space, the guiding baffle covers the heat transfer structure, the heat transfer structure is configured to transfer the thermal energy absorbed by the heat absorbing bottom to the working medium.

In an embodiment of the present disclosure, the base may further include a recess space, the recess space is recessed into the top and located at one side of the heat transfer structure, the heat absorbing space includes the recess space.

In an embodiment of the present disclosure, the cold plate described above may further include a top cover covering the casing, the casing is located between the top cover and the base, and the pump is exposed from the top cover.

The cold plate in accordance with the embodiments of the present disclosure includes the fluid storage chamber defined by the guiding baffle and the casing, and this fluid storage chamber can be in communication with two inlet passages (i.e., the first inlet passage and the second inlet passage), which not only allows the working medium to be temporarily stored to ensure the continuous supply of the working medium, the ease and flexibility in assembling the cold plate are also increased.

The foregoing and other objectives, features and advantages of the present disclosure will become more apparent from the following description taken in conjunction with the accompanying drawings.

DETAILED DESCRIPTION

A cold plate provided by the present disclosure can be installed in a mainframe of a computer or a server. Once the cold plate is filled with a working medium, it can absorb the thermal energy produced by a heat source (e.g., a chip or a memory). The heated working medium can then be transferred to a cooling device to be cooled. Finally, the cooled working medium is returned to the cold plate for another cycle of heat absorption and circulation.

Figure 1:
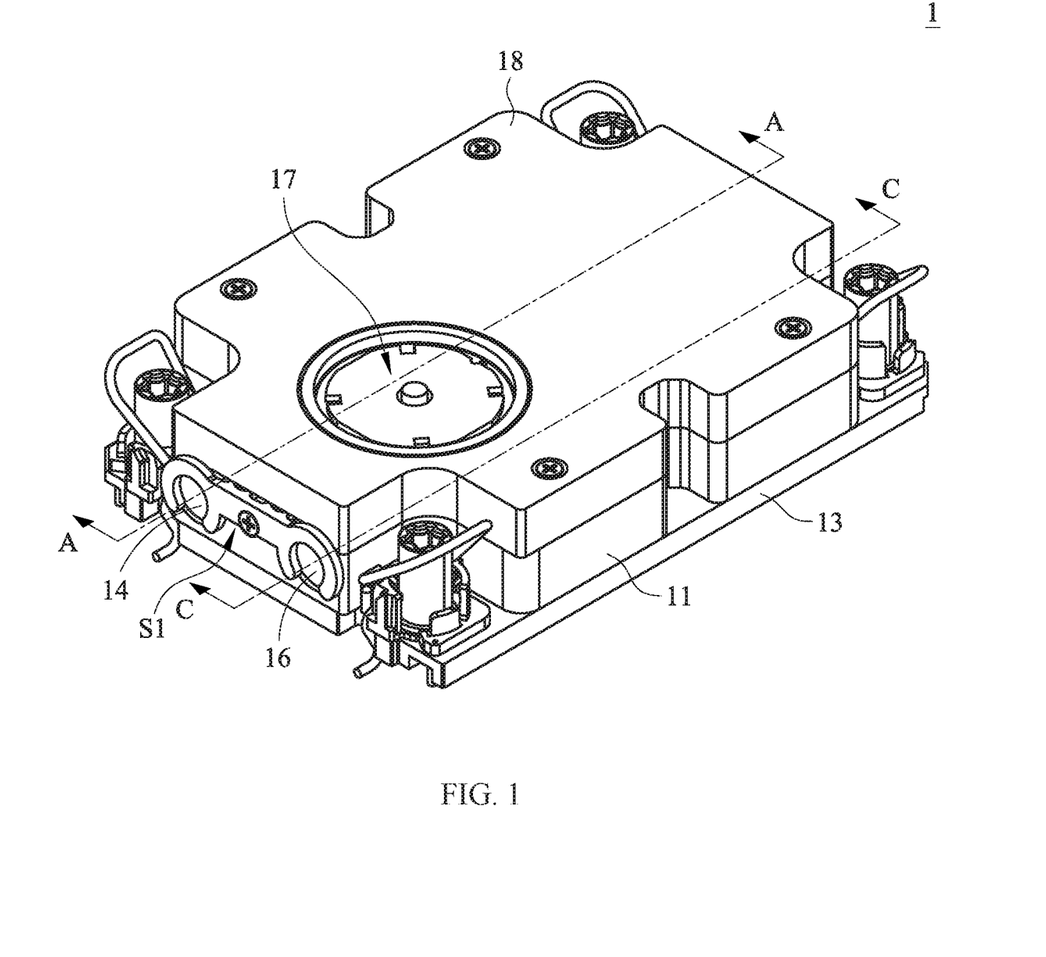
FIG. 1 is a schematic diagram illustrating the exterior structure of a cold plate in accordance with an embodiment of the present disclosure.
Figure 2:
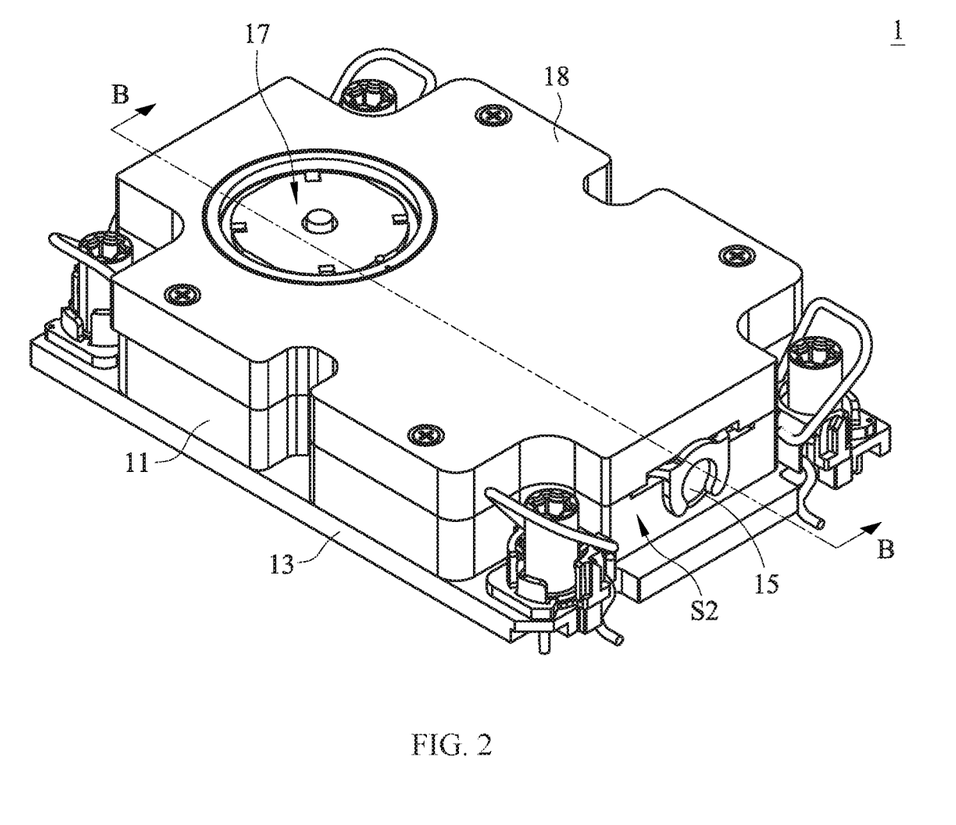
FIG. 2 is a schematic diagram illustrating the exterior structure of the cold plate shown in FIG. 1 from another perspective.
Figure 3:
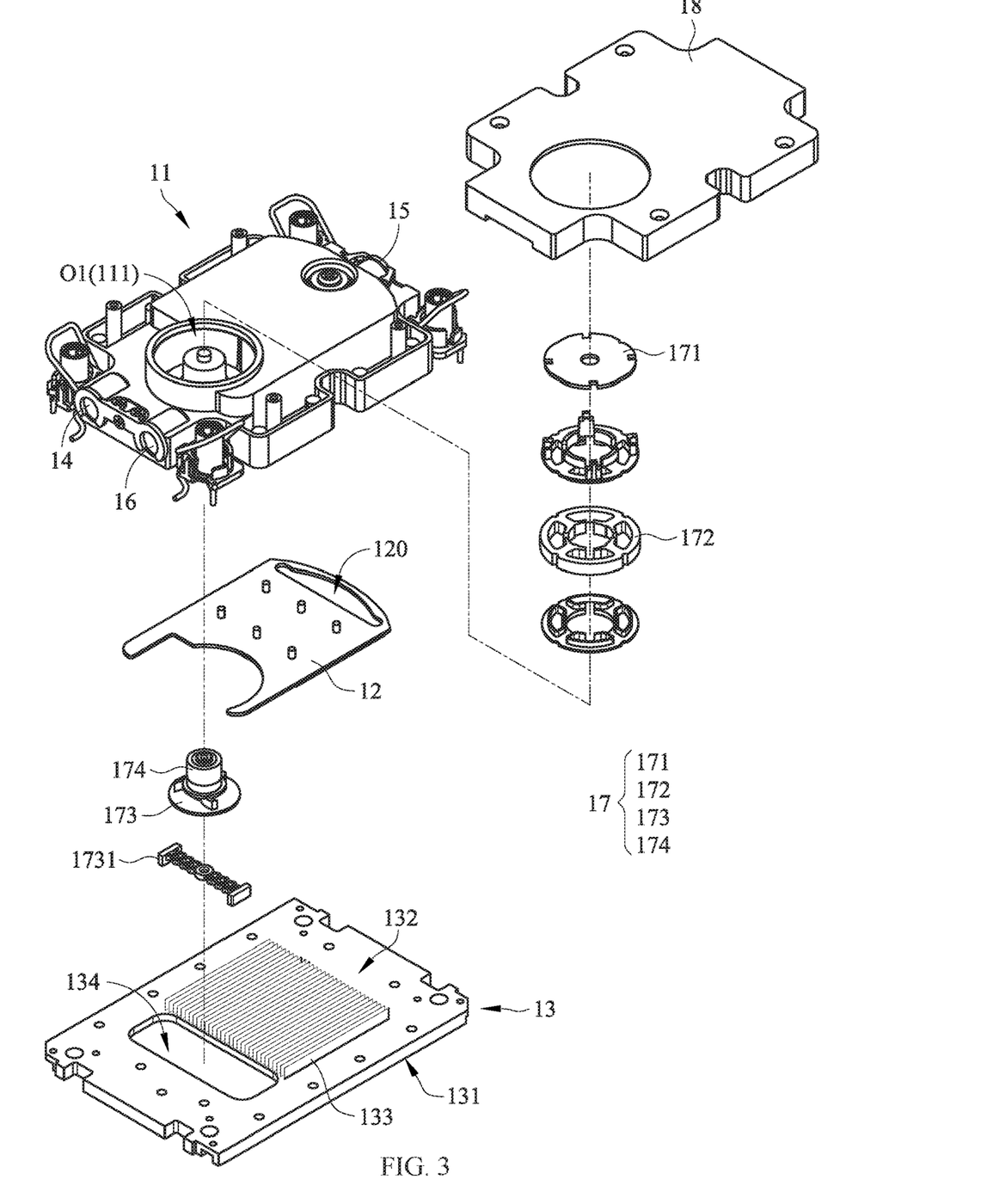
FIG. 3 is a schematic exploded view of the cold plate shown in FIG. 1.
Figure 4:
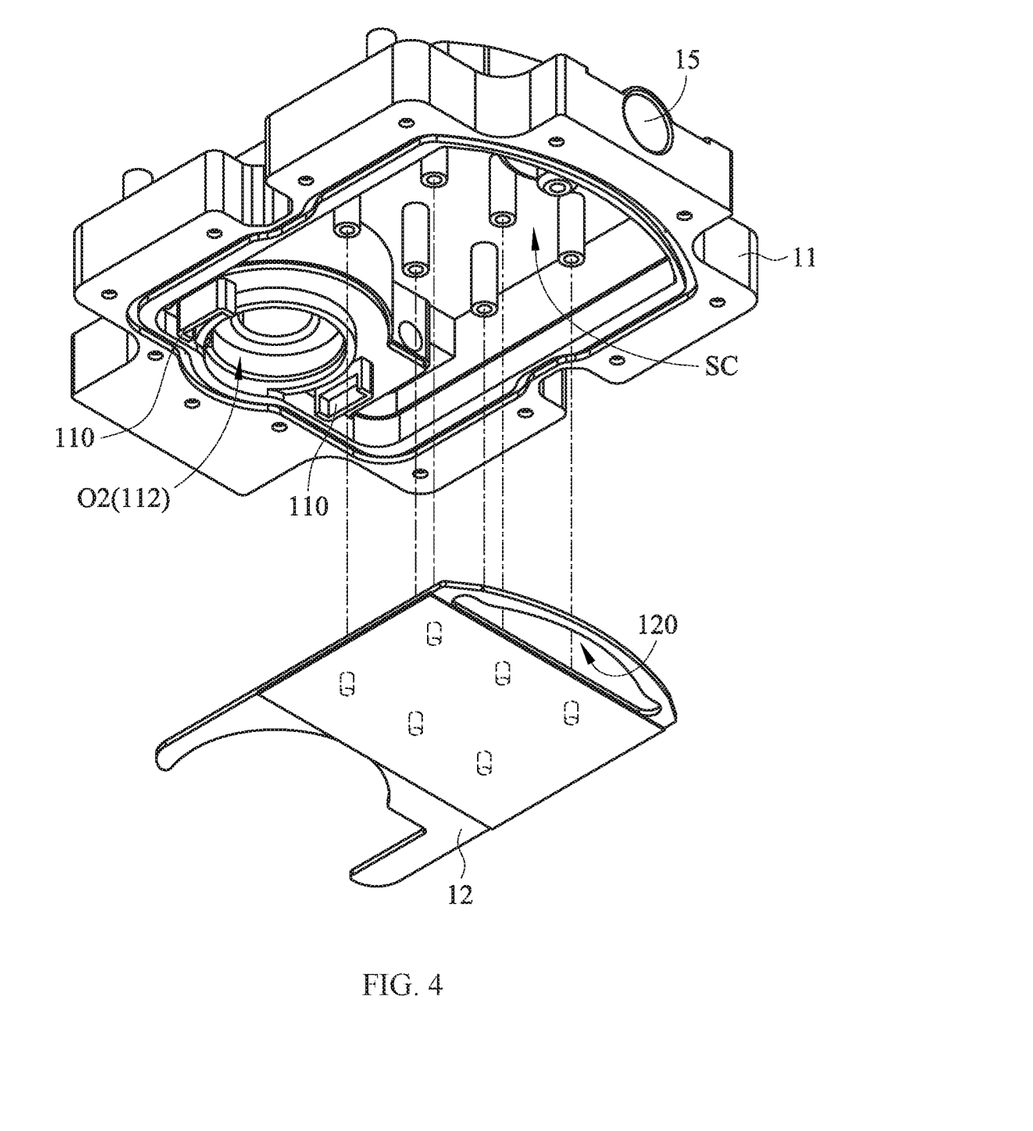
FIG. 4 is a schematic diagram illustrating the assembly of a guiding baffle and a casing of the cold plate shown in FIG. 3 from another perspective.
Figure 5:
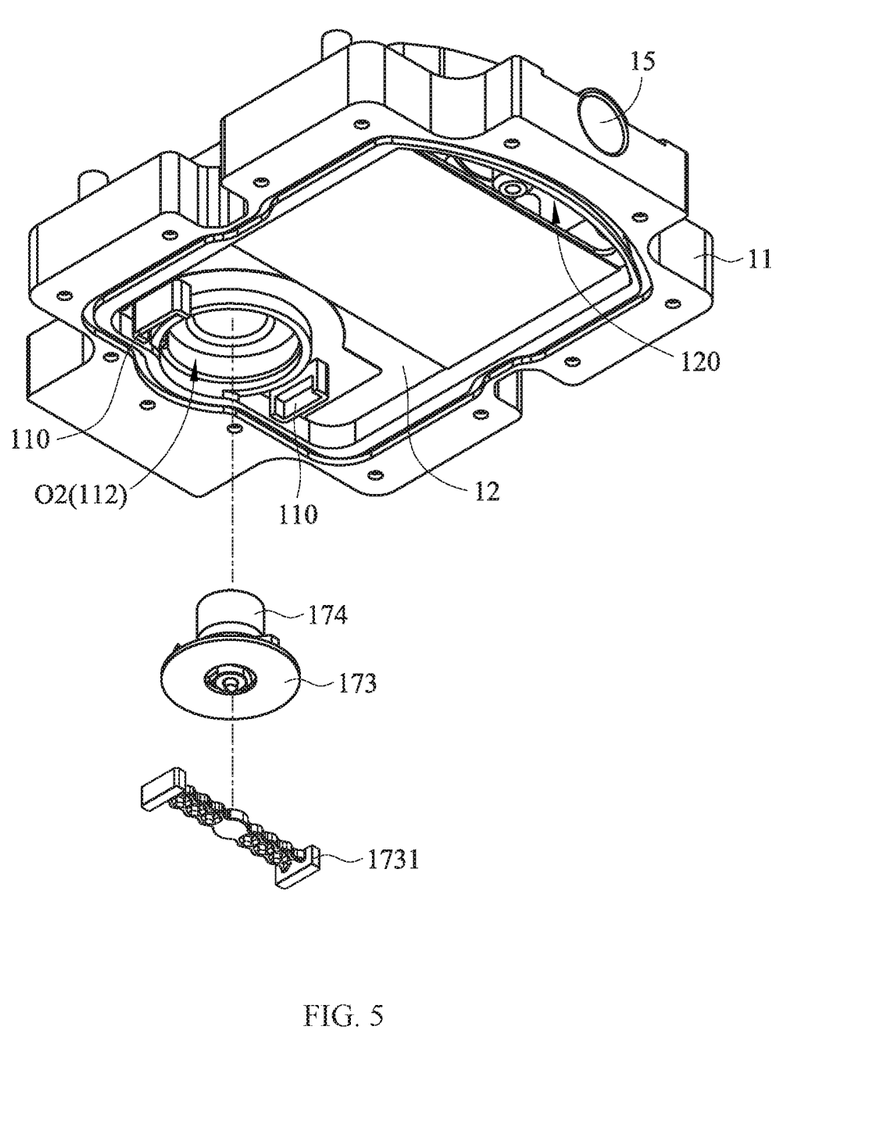
FIG. 5 is a schematic diagram illustrating the assembly of a pump and the casing of the cold plate shown in FIG. 3 from the another perspective.
Figure 6:
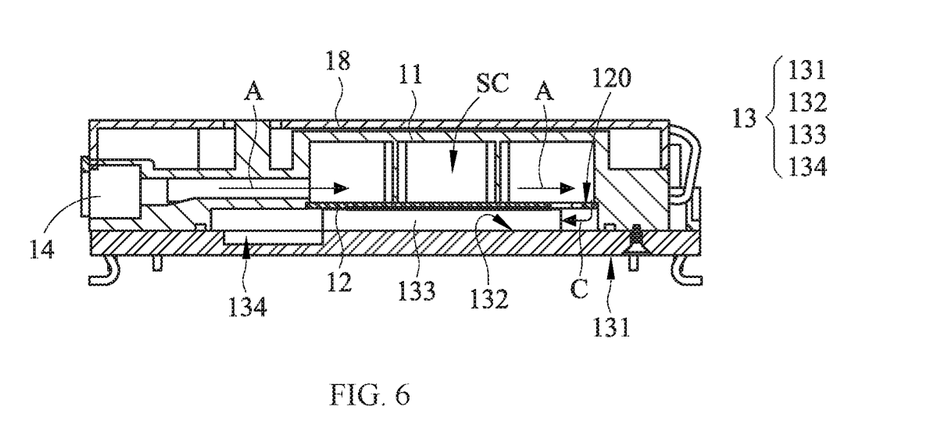
FIG. 6 is a schematic cross-sectional view of the cold plate cut along a line segment A-A in FIG. 1.
Figure 7:
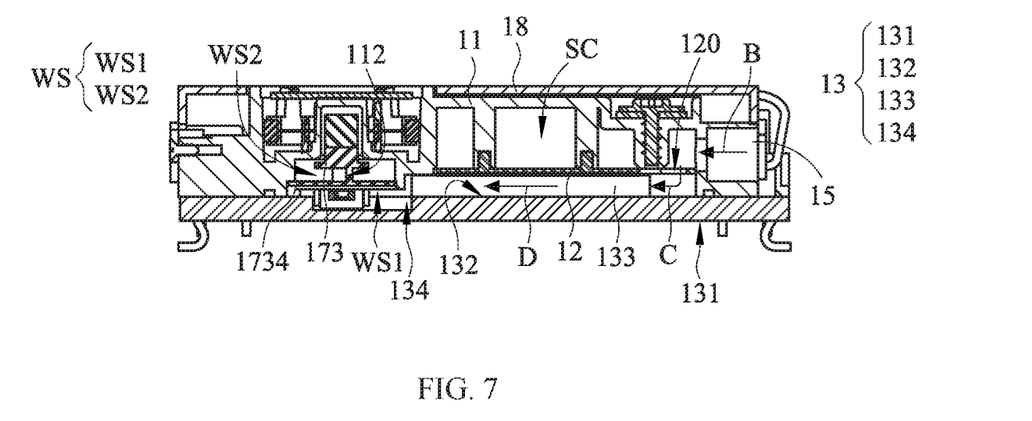
FIG. 7 is a schematic cross-sectional view of the cold plate cut along a line segment B-B in FIG. 2.
Figure 8:
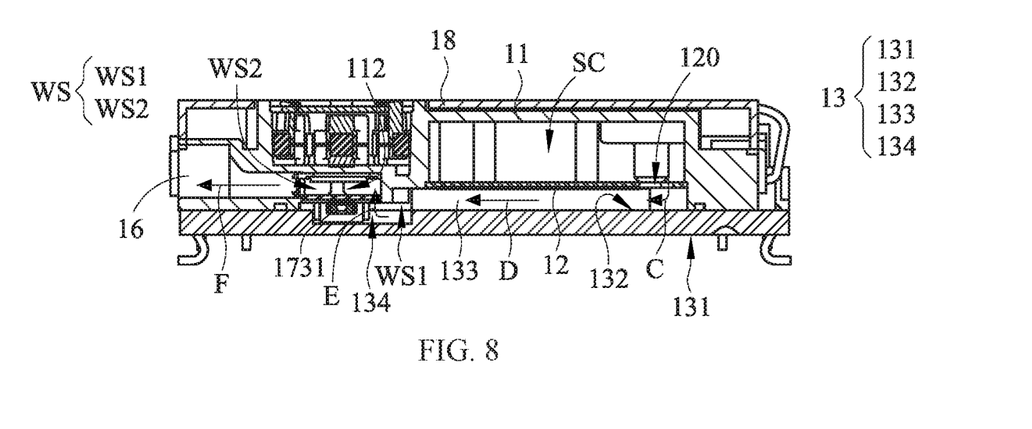
FIG. 8 is a schematic cross-sectional view of the cold plate cut along a line segment C-C in FIG. 1.

Referring to FIGS. 1 to 8, FIG. 1 is a schematic diagram illustrating the exterior structure of a cold plate in accordance with an embodiment of the present disclosure; FIG. 2 is a schematic diagram illustrating the exterior structure of the cold plate shown in FIG. 1 from another perspective; FIG. 3 is a schematic exploded view of the cold plate shown in FIG. 1; FIG. 4 is a schematic diagram illustrating the assembly of a guiding baffle and a casing of the cold plate shown in FIG. 3 from another perspective; FIG. 5 is a schematic diagram illustrating the assembly of a pump and the casing of the cold plate shown in FIG. 3 from the another perspective; FIG. 6 is a schematic cross-sectional view of the cold plate cut along a line segment A-A in FIG. 1; FIG. 7 is a schematic cross-sectional view of the cold plate cut along a line segment B-B in FIG. 2; and FIG. 8 is a schematic cross-sectional view of the cold plate cut along a line segment C-C in FIG. 1.

As shown in FIGS. 1 to 8, a cold plate 1 of this embodiment includes a casing 11, a guiding baffle 12, a base 13, a first inlet passage 14, a second inlet passage 15, an outlet passage 16 and a pump 17. The guiding baffle 12 is disposed in the casing 11 and defines a fluid storage chamber SC together with the casing 11. In other words, when the guiding baffle 12 and the casing 11 are assembled together, a chamber for temporarily storing a working medium can be partitioned by the guiding baffle 12 in the casing 11. The guiding baffle 12 is located between the casing 11 and the base 13, and the guiding baffle 12 includes a communication opening 120. The base 13, the casing 11 and the guiding baffle 12 together define a working space WS. The first inlet passage 14 and the second inlet passage 15 are respectively in communication with the fluid storage chamber SC, such that cooled working medium can flow into the fluid storage chamber SC via the first inlet passage 14 and the second inlet passage 15, respectively. After the working medium flows into the fluid storage chamber SC via the first inlet passage 14 and the second inlet passage 15, it flows through the communication opening 120 of the guiding baffle 12 and into the working space WS, passing through the base 13. The base 13 is used for absorbing thermal energy from a heat source and transferring the thermal energy to the working medium. The outlet passage 16 is in communication with the working space WS. The outlet passage 16 is used for discharging the working medium that has absorbed the thermal energy out of the cold plate 1 from the working space WS. The pump 17 is disposed in the casing 11 and is used for guiding the working medium in the working space WS to the outlet passage 16.

Detailed structure of the cold plate 1 in accordance with the embodiment of the present disclosure is further described below.

As shown in FIGS. 1 to 3, the first inlet passage 14 of this embodiment is located at a first side S1 of the casing 11, the second inlet passage 15 is located at a second side S2 opposite to the first side S1, and the outlet passage 16 is located at the first side S1 of the casing 11 and adjacent to the first inlet passage 14. In order to ensure an uninterrupted supply of the working medium in the cold plate 1, a fluid storage chamber SC is planned in the cold plate 1 of this embodiment, and both the first inlet passage 14 and the second inlet passage 15 are in communication with the fluid storage chamber SC. In the cold plate 1 provided in this embodiment, the first inlet passage 14 and the second inlet passage 15 are disposed at different sides of the fluid storage chamber SC, that is, the first inlet passage 14 is disposed at the first side S1 of the casing 11, while the second inlet passage 15 is disposed at the second side S2 of the casing 11. In the cold plate 1 disclosed by the present disclosure, the working medium can be provided to the fluid storage chamber SC by the first inlet passage 14 and the second inlet passage 15 at different sides and/or different locations of the fluid storage chamber SC. The above structure is just one embodiment of the present disclosure. In other embodiments, the first inlet passage 14 and the second inlet passage 15 can be respectively disposed at different locations of the fluid storage chamber SC, for example, two adjacent sides of the fluid storage chamber SC. By respectively providing the first inlet passage 14 and the second inlet passage 15 at different sides of the cold plate 1, flexibility in assembly by users can be enhanced in that a user can select a suitable inlet passage for providing the working medium based on the design requirements of the user's product.

It should be noted that, in this embodiment, the cold plate 1 includes the first inlet passage 14 and the second inlet passage 15 respectively in communication with the fluid storage chamber SC, but the number of inlet passages of the present disclosure is not limited to just two, and can be increased or reduced depending on the actual needs. For example, just one inlet passage or more than two inlet passages can be provided.

The casing 11 of the cold plate 1 can be covered by a top cover 18. For example, the top cover 18 can be secured using screws tightened into screw holes of the casing 11. After the casing 11 is covered by the top cover 18, the pump 17 is exposed from the top cover 18 to facilitate electrical connection between the pump 17 and the external world. In other embodiments, the top cover 18 can be combined with the casing 11 by thermal bonding or other bonding methods, and the present disclosure is not limited as such. In addition, the top cover 18 can be a transparent or translucent cover, which allows the user to observe the supply of the working medium.

As shown in FIGS. 3 and 5, the casing 11 of this embodiment includes an electromechanical chamber 111 and a groove 112 in communication with each other. An opening O1 of the electromechanical chamber 111 is located at a top side of the casing 11. An opening O2 of the groove 112 is located at a bottom side of the casing 11 opposite to the top side. The pump 17 of this embodiment includes a circuit board 171, a first magnetic component 172, an impeller 173 and a second magnetic component 174. The circuit board 171 and the first magnetic component 172 of the pump 17 are disposed in the electromechanical chamber 111 of the casing 11. The circuit board 171 is provided on top of the first magnetic component 172, and the circuit board 171 is exposed from the opening O1 of the electromechanical chamber 111. The impeller 173 and the second magnetic component 174 of the pump 17 are disposed in the groove 112 of the casing 11. The second magnetic component 174 is located between the first magnetic component 172 and the impeller 173, and the second magnetic component 174 is passed through the first magnetic component 172 to be coaxially provided with the first magnetic component 172.

In addition, the cold plate 1 provided by this embodiment has a compact design in that the electromechanical chamber 111 and the groove 112 for accommodating the pump 17 are separated from the fluid storage chamber SC and respectively disposed at different planar positions with respect to the casing 11 rather than being overlapped in the vertical direction, thereby reducing the height of the cold plate 1.

In this embodiment, the circuit board 171 of the pump 17 is connected with a power supply (not shown) through a wired (via wires) or a wireless (e.g., via electromagnetic induction or other wireless methods) connection for providing the power needed to operate the pump 17. The electromechanical chamber 111 of the casing 11 is a space sealed from water, so as to prevent the circuit board 171 and the first magnetic component 172 or other electrical components such as wires from short circuiting. Furthermore, the impeller 173 and the second magnetic component 174 of the pump 17 are disposed in the groove 112 of the casing 11, i.e., on the flow path of the working medium. Thus, when the pump 17 is turned on to rotate the impeller 173, the working medium can be guided by the impeller 173 and the casing 11, thus generating a flow.

In this embodiment, the first magnetic component 172 and the second magnetic component 174 are coaxially disposed. The two components are separated by the casing 11. The first magnetic component 172 and the second magnetic component 174 can be made of a material selected from magnet or other magnetic material that can be actuated by a magnetic field. Furthermore, the second magnetic component 174 is combined with the impeller 173. When the pump 17 is energized, the impeller 173 connected with the second magnetic component 174 can be driven into rotation as a result of the interactions between the circuit board 171, the first magnetic component 172 and the second magnetic component 174.

As shown in FIGS. 1 to 3, the base 13 of this embodiment is mainly responsible for absorbing thermal energy, so the material of the base 13 can be selected from a metal or other materials with good thermal conductivity. The base 13 is a one-piece structure or a composite structure with a plurality of layers or components. The present disclosure is not limited to a particular construction of the base 13. The outer side of the base 13, i.e., the side facing away from the casing 11 includes a heat absorbing bottom 131. A top 132 (i.e., the side facing the casing 11) of the base 13 is formed or provided with a heat transfer structure 133. The guiding baffle 12 covers the heat transfer structure 133 of the base 13 (as shown in FIG. 6). When the heat absorbing bottom 131 of the base 13 comes into direct or indirect thermal contact with the heat source, the heat absorbing bottom 131 will absorb the thermal energy and transfer it to the heat transfer structure 133 above. The heat transfer structure 133 will then transfer the thermal energy to the working medium (not shown) by being in contact with the working medium. The heat transfer structure 133 of the base 13 can be selected from skived fins, other columnar, sheet-like or irregularly shaped fins. The gaps between adjacent fins allow the working medium to pass through. Increasing the contact area between the working medium and the fins (e.g., by increasing density of the fins) allows thermal energy to be more quickly transferred to the working medium. In addition, in order to prevent wear and tear as a result of direct contact between the guiding baffle 12 and the heat transfer structure 133, a sponge (not shown) can be optionally disposed between the guiding baffle 12 and the heat transfer structure 133.

Referring to FIGS. 6 to 8 in conjunction with FIGS. 1 to 3, in this embodiment, the base 13 of the cold plate 1 is secured to the casing 11 from underneath the casing 11 by screws or other fasteners. After the casing 11 and the base 13 of the cold plate 1 are joined together, the casing 11, the base 13 and the guiding baffle 12 together defines the working space WS through which the working medium can flow. The working space WS is generally partitioned into a heat absorbing space WS1 and a fluid discharging space WS2 by the impeller 173 of the pump 17. The groove 112 of the casing 11 includes the fluid discharging space WS2, and a portion of the heat absorbing space WS1 is located below the guiding baffle 12 without the need for any other portioning walls or partitions, thereby simplifying the internal structure of the cold plate 1. The heat transfer structure 133 provided at the top 132 of the base 13 is located in the heat absorbing space WS1. In addition, the base 13 of this embodiment further includes a recess space 134. The recess space 134 is recessively provided at the top 132 of the base 13 and at one side of the heat transfer structure 133. The recess space 134 is also located within the heat absorbing space WS1. In the cold plate 1 provided by this embodiment, the communication opening 120 of the guiding baffle 12 is structurally in communication with the fluid storage chamber SC (at the top) and the heat absorbing space WS1 (at the bottom) to allow the working medium to flow from the fluid storage chamber SC into the heat absorbing space WS1. It should be noted that, in this embodiment, the communication opening 120 of the guiding baffle 12 is provided at a location near the second inlet passage 15, but the present disclosure is not limited as such. The location of the communication opening 120 of the guiding baffle 12 can be adjusted depending on the location of the inlet passage. The flow path of the working medium in the cold plate 1 is described in detail below.

As shown in FIGS. 6 to 8, in this embodiment, the working medium entering the cold plate 1 can be selected to flow into the fluid storage chamber SC via the first inlet passage 14 (along the direction of arrow A) or via the second inlet passage 15 (along the direction of arrow B). Then, the working medium changes its direction at the communication opening 120 of the guiding baffle 12 to flow into the heat absorbing space WS1 along the direction of arrow C. Thereafter, the working medium passes through the heat transfer structure 133 present in the heat absorbing space WS1 along the direction of arrow D, taking the thermal energy absorbed by the heat transfer structure 133 along with it. The working medium is then sucked from the heat absorbing space WS1 to the fluid discharging space WS2 by the impeller 173 as indicated by the direction of arrow E. Finally, the working medium is discharged from the cold plate 1 via the outlet passage 16 in communication with the fluid discharging space WS2 along the direction of arrow F to the outside to cool the heated working medium.

Furthermore, it should be noted that the first inlet passage 14, the second inlet passage 15 and the outlet passage 16 can be respectively extended further out or connected with connectors, which in turn, are connected to a cooling device, such as a radiator, via pipes (not shown).

Figure 9:
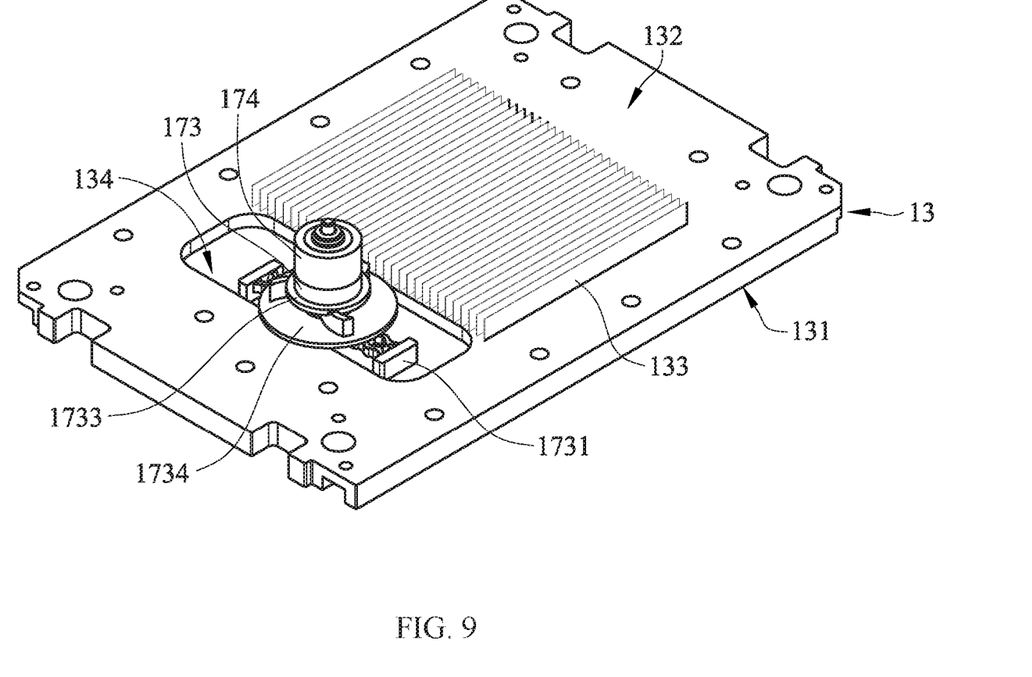
FIG. 9 is a schematic diagram illustrating the assembly of the impeller and the base of the pump shown in FIG. 3.
Figure 10:
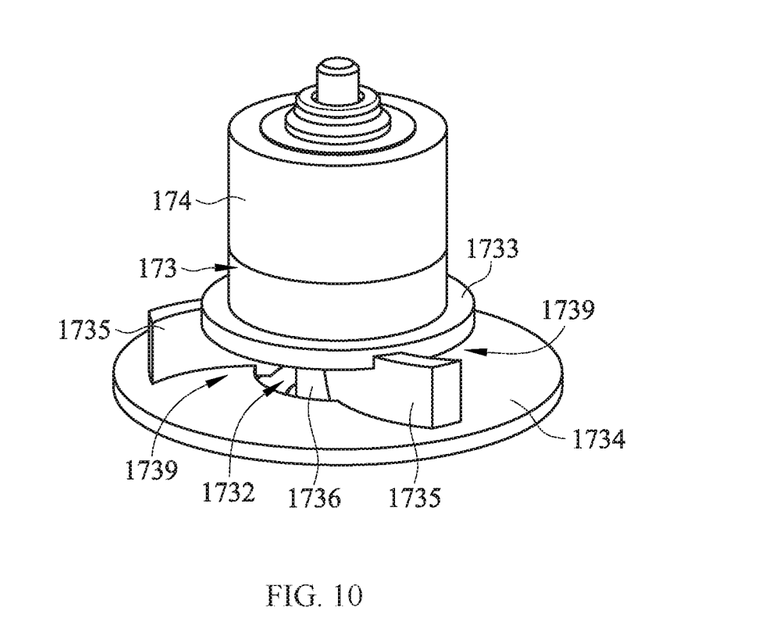
FIG. 10 is a schematic diagram illustrating the exterior structure of the impeller of the pump shown in FIG. 3 in one perspective.
Figure 11:
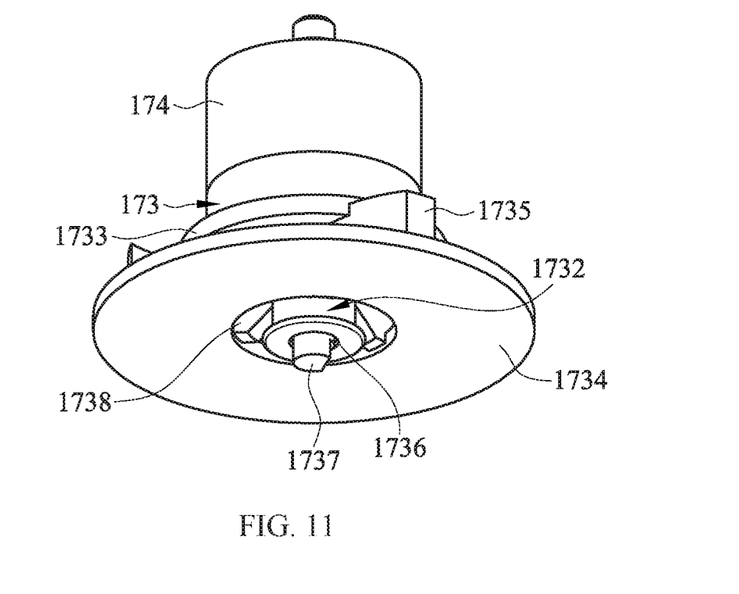
FIG. 11 is a schematic diagram illustrating the exterior structure of the impeller of the pump shown in FIG. 10 in another perspective.

Referring to FIGS. 9 to 11, FIG. 9 is a schematic diagram illustrating the assembly of the impeller and the base shown in FIG. 3; FIG. 10 is a schematic diagram illustrating the exterior structure of the impeller of the pump shown in FIG. 3 in one perspective; and FIG. 11 is a schematic diagram illustrating the exterior structure of the impeller of the pump shown in FIG. 10 in another perspective. As shown in FIGS. 9 to 11, in the heat absorbing space WS1 of the cold plate 1, the impeller 173 and a fastening component 1731 are provided on top of the recess space 134 of the base 13, that is, the fastening component 1731 is located between the impeller 173 and the base 13. This is to ensure that the working medium, after absorbing the thermal energy from the heat transfer structure 133, can be sucked directly by hollow portions 1732 of the impeller 173. The working medium will only be hindered slightly by the fastening component 1731 before passing into the impeller 173, and no other portioning walls or partitions or covers are provided in the casing 11 to guide the working medium, thereby simplifying the interior structure of the cold plate 1. Moreover, the impeller 173 and the second magnetic component 174 are secured to the base 13 via the fastening component 1731, and are also located inside the groove 112 of the casing 11 at the same time.

As shown in FIGS. 10 and 11, as described before, in the cold plate 1 provided in this embodiment, the working space WS is generally partitioned into the heat absorbing space WS1 and the fluid discharging space WS2 by the impeller 173 of the pump 17. Therefore, the impeller 173 has dual functions for sucking the working medium in and for discharging the working medium. In order to attain this functionality, the impeller 173 provided by the present disclosure is disposed in the working space WS in proximity to the outlet passage 16, so the working medium can be sucked directly from the heat absorbing space WS1 into the fluid discharging space WS2 before being discharged out of the cold plate 1. In addition to the hollow portions 1732, the impeller 173 further includes a top wall 1733, a base plate 1734, vanes 1735, a bushing 1736, and a shaft 1737, wherein the hollow portions 1732 are formed at the junction of the base plate 1734 and the bushing 1736, and the base plate 1734 and the bushing 1736 are connected through ribs 1738 between adjacent hollow portions 1732. The partitioning of the working space WS into the heat absorbing space WS1 and the fluid discharging space WS2 is mainly attributed to the base plate 1734 in the impeller 173. Fluid coupling between the heat absorbing space WS1 and the fluid discharging space WS2 is achieved with the help of the hollow portions 1732, that is, the working medium can enter into the fluid discharging space WS2 from the heat absorbing space WS1 via the hollow portions 1732. The top wall 1733 and the base plate 1734 are spaced apart with a plurality of vanes 1735 connected therebetween, thereby forming a plurality of fluid discharging chambers 1739. In the process of transmitting the working medium from the heat absorbing space WS1 upwards into the fluid discharging space WS2 via the hollow portions 1732, the working medium will come into contact with the top wall 1733 and get deflected to the various fluid discharging chambers 1739. The working medium in the fluid discharging chambers 1739 is then spun into the outlet passage 16 via the centrifugal force to be discharged from the cold plate 1. The top wall 1733 of the impeller 173 not only helps to deflect the flow of the working medium, but also prevents the vanes 1735 from directly coming into contact with the casing 11 to reduce wear and tear.

Moreover, the impeller 173 of the pump 17 provided in this embodiment is driven by the electromagnetic induction between the first magnetic component 172 and the second magnetic component 174 not by the shaft 1737. Thus, there is no linkage relationship between the impeller 173 and the shaft 1737. However, in order to maintain the durability and stability of the impeller 173 so that it does not rotate off axis or touch the casing 11 and cause wear and tear during rotation, a hollow bushing 1736 is thus provided inside the impeller 173 and sheathed onto the shaft 1737. In addition, in order to secure the shaft 1737, the fastening component 1731 is provided in the cold plate 1 to receive one end of the shaft 1737. The fastening component 1731 includes a blind hole into which the shaft 1737 can be installed. Moreover, the fastening component 1731 can be received and secured in wedging grooves 110 provided at the bottom of the casing 11 facing the working space WS, or it can be installed in the recess space 134 of the base 13, and the present disclosure is not limited as such.

In conclusion, the cold plate of the present disclosure includes the fluid storage chamber defined by the guiding baffle and the casing, and this fluid storage chamber can be in communication with two inlet passages (i.e., the first inlet passage and the second inlet passage), which not only allows the working medium to be temporarily stored to ensure the continuous supply of the working medium, the ease and flexibility in assembling of the cold plate are also increased.

The above embodiments are merely provided for illustrating the embodiments of the present disclosure, and should not be construed as to limit the scope of the present disclosure in any way. The above embodiments that are equivalently modified and changed by one with ordinary skill in the art upon obtaining the appended claims and the descriptions above, should be construed as not departing from the spirit and scope of the present disclosure. Moreover, it is not necessary for any embodiment or claims of the present disclosure to achieve all of the objectives, advantages or features disclosed herein. In addition, the abstract and the title of this specification are provided to aid in searching related documents, they should not be construed as to limit the scope of the claims. Furthermore, terms such as "first," "second" recited herein or in the appended claims are merely used for naming various elements or for distinguishing between different embodiments or ranges, they should not be interpreted as placing an upper or lower limit on the numbers of said elements.

What is claimed is:

1. A cold plate, comprising:
   a casing;
   a guiding baffle disposed in the casing and defining a fluid storage chamber together with the casing, the fluid storage chamber being filled with a working medium and the guiding baffle including a communication opening;
   a base configured to absorb a thermal energy and transfer the thermal energy to the working medium, with the base, the casing and the guiding baffle together defining a working space, and the guiding baffle being located between the casing and the base, wherein the working medium flows into the working space through the communication opening;
   a first inlet passage in communication with the fluid storage chamber, allowing the working medium to flow into the fluid storage chamber;
   an outlet passage communicating with the working space to allow the working medium to be discharged from the working space; and
   a pump disposed in the casing and partially disposed in the working space, and configured to guide the working medium in the working space to the outlet passage to be discharged out of the working space,
   wherein the pump includes an impeller, the impeller having a plurality of hollow portions, a top wall, a base plate, a plurality of vanes, a bushing and a plurality of ribs,
   wherein the hollow portions are formed at a junction of the base plate and the bushing, and the base plate and the bushing are connected through the ribs between adjacent ones of the hollow portions,
   wherein the top wall and the base plate are spaced apart with the vanes connected therebetween,
   wherein the base plate partitions the working space into a heat absorbing space and a fluid discharging space.

2. The cold plate of claim 1, further comprising a second inlet passage in communication with the fluid storage chamber.

3. The cold plate of claim 2, wherein the first inlet passage is located at a first side of the casing, and the second inlet passage is located at a second side of the casing opposite to the first side.

4. The cold plate of claim 3, wherein the outlet passage is located at the first side of the casing adjacent to the first inlet passage.

5. The cold plate of claim 1, wherein the casing includes an electromechanical chamber and a groove, with an opening of the electromechanical chamber being located at a top side of the casing, and an opening of the groove being located at a bottom side of the casing opposite to the top side.

6. The cold plate of claim 5, wherein the pump further includes a circuit board, a first magnetic component and a second magnetic component.

7. The cold plate of claim 6, wherein the circuit board and the first magnetic component are disposed in the electromechanical chamber.

8. The cold plate of claim 7, wherein the circuit board is provided on a top of the first magnetic component and exposed from the opening of the electromechanical chamber.

9. The cold plate of claim 8, wherein the impeller and the second magnetic component are disposed in the groove.

10. The cold plate of claim 9, wherein the second magnetic component is located between the first magnetic component and the impeller, and passes through the first magnetic component to be coaxially provided with the first magnetic component.

11. The cold plate of claim 10, wherein the pump further includes a fastening component provided between the impeller and the base.

12. The cold plate of claim 11, wherein the fastening component is secured onto the casing to secure the impeller and the second magnetic component in the groove.

13. The cold plate of claim 10, wherein the groove includes the fluid discharging space, and a portion of the heat absorbing space is located below the guiding baffle.

14. The cold plate of claim 13, wherein the working medium in the heat absorbing space and the fluid discharging space undergoes fluid coupling through the hollow portions, with the working medium flowing into the heat absorbing space through the communication opening and being sucked from the heat absorbing space by the impeller and passed into the fluid discharging space via the hollow portions.

15. The cold plate of claim 14, wherein the base includes a top and a heat absorbing bottom opposite to each other.

16. The cold plate of claim 15, wherein the heat absorbing bottom is in contact with a heat source and absorbs the thermal energy, and the top is provided with a heat transfer structure located in the heat absorbing space.

17. The cold plate of claim 16, wherein the guiding baffle covers the heat transfer structure configured to transfer the thermal energy absorbed by the heat absorbing bottom to the working medium.

18. The cold plate of claim 17, wherein the base further includes a recess space recessed into the top and located at one side of the heat transfer structure, and the heat absorbing space includes the recess space.

19. The cold plate of claim 1, further comprising a top cover covering the casing located between the top cover and the base, with the pump being exposed from the top cover.

\* \* \* \* \*